United States Patent
Watanabe et al.

(10) Patent No.: US 6,280,522 B1
(45) Date of Patent: Aug. 28, 2001

(54) QUARTZ GLASS CRUCIBLE FOR PULLING SILICON SINGLE CRYSTAL AND PRODUCTION PROCESS FOR SUCH CRUCIBLE

(75) Inventors: Hiroyuki Watanabe, Takefu; Hiroyuki Miyazawa; Tatsuhiro Sato, both of Koriyama; Satoshi Soeta; Tetsuya Igarashi, both of Takefu, all of (JP)

(73) Assignees: Shin-Etsu Quartz Products Co. Ltd.; Shin-Etsu Handotai Co., Ltd., both of Tokyo (JP)

( * ) Notice: Subject to any disclaimer, the term of this patent is extended or adjusted under 35 U.S.C. 154(b) by 0 days.

(21) Appl. No.: 09/508,695

(22) PCT Filed: Jul. 27, 1999

(86) PCT No.: PCT/JP99/04006

§ 371 Date: Mar. 29, 2000

§ 102(e) Date: Mar. 29, 2000

(87) PCT Pub. No.: WO00/06811

PCT Pub. Date: Feb. 10, 2000

(30) Foreign Application Priority Data

Jul. 31, 1998  (JP) .................................................. 10-217836

(51) Int. Cl.⁷ .................................................. C30B 13/22
(52) U.S. Cl. .................................. 117/29; 65/30.1; 65/33; 65/DIG. 8; 427/167; 427/255
(58) Field of Search .................. 65/30.1, 33, DIG. 8; 117/29; 427/96, 167, 255

(56) References Cited

U.S. PATENT DOCUMENTS 6,106,610 * 9/1998 Watanabe et al. ...................... 117/13

FOREIGN PATENT DOCUMENTS

| 61-44793 | 3/1986 | (JP) . |
| 1-148718 | 6/1989 | (JP) . |
| 2-9783 | 1/1990 | (JP) . |
| 4-21587 | 1/1992 | (JP) . |
| 4-202086 | 7/1992 | (JP) . |
| 8-2932 | 1/1996 | (JP) . |
| 9-52791 | 2/1997 | (JP) . |

* cited by examiner

Primary Examiner—Felisa Hiteshew
(74) Attorney, Agent, or Firm—Arent Fox Kintner Plotkin & Kahn, PLLC

(57) ABSTRACT

There is provided a quartz glass crucible for pulling a silicon single crystal and a production process for the crucible, wherein an inner surface of the crucible is crystallized without addition of impurities during pulling a silicon single crystal, thereby impurities serving as causes of crystal defects being not incorporated into the silicon single crystal, so that deterioration of its inner surface is suppressed to improve a crystallization ratio, and accordingly productivity of the quartz glass crucible as well as a quality of the silicon single crystal is improved, and the quartz glass crucible for pulling a silicon single crystal comprises a crucible base body (3) made of a translucent quartz glass layer and a synthetic quartz glass layer (4) formed on an inner wall surface of the crucible base body (3), wherein a portion encircled by a brown ring on an inner surface of the quartz glass crucible is uniformly crystallized during pulling the silicon single crystal.

19 Claims, 3 Drawing Sheets

QUARTZ GLASS CRUCIBLE FOR PULLING SILICON SINGLE CRYSTAL AND PRODUCTION PROCESS FOR SUCH CRUCIBLE

TECHNICAL FIELD

The present invention relates to a quartz glass crucible used for pulling a silicon single crystal and a production process for the quartz glass crucible.

BACKGROUND ART

A so-called Czochralski method has heretofore widely been adopted in production of single crystal material such as single crystal semiconductor material. This method comprises steps of melting polycrystal silicon in a vessel into a melt, dipping an end portion of a seed crystal into the melt and pulling the seed crystal while rotating, wherein a single crystal with the same crystal orientation as that of the seed is grown on the seed. A quartz glass crucible is generally used as the vessel for pulling silicon single crystal.

In a general case of pulling a silicon single crystal, a quartz glass crucible holds a silicon melt at a temperature higher than 1400° C. for a long time. While this holding time changes depending on various pulling conditions, it usually takes tens of hours or, in the longest case, more than 100 hours to complete pulling of a silicon single crystal(s) from a melt in a quartz glass crucible with an outer diameter of 20 inches or more.

In such a long-time pulling case, cristobalite in brown color is produced in small ring like patterns on a surface of a quartz glass crucible whose surface has been put in contact with a silicon melt and as time elapses, the patterns change in shape and grow in size on the surface of a quartz glass crucible (see FIG. 3). It has been known that when a portion encircled by this brown ring is eroded to expose a rough surface, dislocations are apt to be generated in a silicon single crystal in growth, which causes inconvenience in the pulling.

As shown in FIG. 3, the brown ring does not necessarily keep its original ring shape in the course of growing larger in size, but for simplicity of description, modifications or alterations evolved from the brown rings are generally referred to as brown ring throughout the present specification hereinafter.

A brown ring described above, as shown in FIGS. 3(i) to 3(iv), is created as a ring pattern (B) in brown color (see FIG. 3(ii)), on an inner surface (A) (see FIG. 3(i)) of a normal quartz glass crucible at the outset, while the shape of the brown ring changes and broadens in various way, as time elapses, and a white cristobalite layer (C) is then formed in a portion encircled by the brown ring (B). As time further elapses, devitrified specks (D) come out in the white cristobalite layer in an irregular manner (see FIG. 3(iii)) and as time still further elapses, the portion encircled by the brown ring (B) is gradually eroded to start exposing a glass dissolving surface (amorphous) (E) with a rough appearance (see FIG. 3(iv)). Once this glass dissolving surface appears, dislocations are apt to be generated in a silicon single crystal in growth, which entails reduction in crystallization ratio.

There has been a proposal of a crucible whose inner wall is formed with crystobalite as disclosed in Japanese Patent Laid-open Publication No.9-52791. The proposed method, however, is such that synthetic quartz is molten and then gradually cooled to obtain blocks of crystobalite quartz, the blocks are cut into pieces each in a proper shape and the pieces are welded on a quartz glass crucible. Hence, the method is not satisfactorily accepted in terms of productivity of crucibles.

As shown in Japanese Patent Laid-open Publication No.8-2932, there has been another proposal of a method of preventing roughening of a crucible inner surface during pulling a silicon single crystal by formation of a crystalline layer on the crucible inner surface, wherein the crystalline layer is produced by forming a coating film or a solid solution layer which contains a crystallization accelerating agent in thickness of 1 mm or less from the inner surface portion of a quartz glass crucible for pulling a silicon single crystal. According to this method, however, impurities are mixed into a single crystal through a silicon melt or an atmosphere surrounding the melt when adding the crystallization accelerating agent, the impurities disadvantageously serving as causes of increase in crystal defects of the single crystal.

With the foregoing problems of the prior art in view, an object of the present invention to provide a quartz glass crucible for pulling a silicon single crystal and a production process for the crucible, wherein an inner surface of the crucible is crystallized without addition of impurities during pulling a silicon single crystal, thereby impurities serving as causes of crystal defects being not incorporated into the silicon single crystal, so that deterioration of its inner surface is suppressed to improve a crystallization ratio, and accordingly productivity of the quartz glass crucible as well as a quality of the silicon single crystal is improved.

DISCLOSURE OF THE INVENTION

In order to solve the above described problem, a first aspect of a quartz glass crucible for pulling a silicon single crystal of the present invention is a quartz glass crucible for pulling a silicon single crystal comprising: a crucible base body made of a translucent quartz glass layer; and a synthetic quartz glass layer formed on an inner wall surface of the crucible base body, wherein a portion encircled by a brown ring on an inner surface of the quartz glass crucible is uniformly crystallized during pulling the silicon single crystal using the quartz glass crucible.

A second aspect of a quartz glass crucible for pulling a silicon single crystal of the present invention is a quartz glass crucible for pulling a silicon single crystal comprising: a crucible base body made of a translucent quartz glass layer; and a synthetic quartz glass layer formed on an inner wall surface of the crucible base body, wherein a viscosity of the synthetic quartz glass layer is $10.3 \times 10^9$ to $11.0 \times 10^9$ $N \cdot s/m^2$ at 1400° C.

The viscosity of the synthetic quartz glass layer formed on the inner wall surface of the crucible base body of the second aspect of a quartz glass crucible for pulling a silicon single crystal of the present invention may be set in a predetermined range by adjusting a hydroxyl group content and a nitrogen content therein.

The hydroxyl group content in the synthetic quartz glass layer formed on the inner wall surface of the crucible base body of the second aspect of a quartz glass crucible for pulling a silicon single crystal of the present invention is preferably in the range of 50 to 250 ppm. If the hydroxyl group content is 50 ppm or more, uniformity of crystallization on the crucible inner surface may be more excellent. On the other hand, if the hydroxyl group content is in excess of 250 ppm, there are possibilities of dissolution loss, deformation and other troubles of the crucible depending on conditions for pulling a silicon single crystal because of a relatively low viscosity at a high temperature.

The nitrogen content in the synthetic quartz glass layer is preferably in the range of 1 to 100 ppm. If the nitrogen content is 1 ppm or more, heat resistance of the crucible may be improved with more ease. On the other hand, if the nitrogen content is beyond 100 ppm, there is likely to lead to a possibility of relatively reducing uniformity in crystallization of the inner surface of the crucible.

A thickness of the synthetic quartz glass layer is preferably in the range of 1 mm to 5 mm. If the thickness is less than 1 mm, a crystallization ratio is greatly reduced since quartz glass is dissolved into silicon melt during pulling of a silicon single crystal to reveal a translucent quartz glass layer (the outer layer). If the synthetic quartz glass layer (the inner layer) of the thickness more than 5 mm is formed, it is disadvantageous from the viewpoint of productivity and economy of crucible production. Considering an overall thickness of a quartz glass crucible, it can be said that it is not to be preferable to excessively increase the thickness of the synthetic quartz glass layer (the inner layer), from the viewpoint of the facts, either, that if the translucent quartz glass layer (the outer layer) is too thin, heat uniformity is disturbed and thereby inconvenience arises in control of thermal convection of the silicon melt with the result that a quality of a silicon single crystal is adversely influenced.

The viscosity of the synthetic quartz glass layer is preferably set in the range of $10.3 \times 10^9$ to $11.0 \times 10^9$ N·s/m$^2$ at 1400° C. When the viscosity is outside the range, there arises a possibility of relatively reducing uniformity of crystallization of the inner surface of a crucible, or there is likely to dissolution, deformation or other troubles of a crucible due to an insufficient high temperature viscosity, depending on pulling conditions for a silicon single crystal.

It has been known that if there is present impurities such as metallic elements or the like, quartz glass starts crystallization with impurities each as a nucleus. It has been believed that a specific element has an accelerating function in crystallization. When a crystal is formed on the inner surface of a quartz glass crucible using impurities such as metallic elements, the impurities are dissolved into the silicon melt during pulling a silicon single crystal, with the result that the impurities are incorporated into the single crystal ingot and thereby crystal defects generate in the ingot. Therefore, such impurities are not preferable.

Therefore, according to the present invention, a hydroxyl group content and a nitrogen content of quartz glass are adjusted to respective predetermined values and thereby a viscosity of a synthetic quartz glass layer of a quartz glass crucible is set to a value in a predetermined range while impurities such as metallic elements are not added. Accordingly, when a silicon single crystal is pulled using the quartz glass crucible, the portion encircled by a brown ring on the inner surface of the quartz glass crucible is uniformly crystallized.

In this way, dislocations in a silicon single crystal caused by deterioration of the inner surface of a quartz glass crucible is suppressed and thereby productivity of silicon single crystal is improved. Furthermore, since the inner surface reinforced with crystobalite can endure a long time usage at a high temperature, a crucible with such a reinforced inner surface can sufficiently cope with pulling of a silicon single crystal larger in diameter and length, which will be further developed in a future trend.

A first aspect of a production process for a quartz glass crucible for pulling a silicon single crystal of the present invention is a production process for a quartz glass crucible for pulling a silicon single crystal in which a rotary upward-open mold is used, comprising:

(a) a step of forming a preform in conformity of an inner surface of the mold by supplying silica powder into the mold;

(b) a step of forming a crucible base body made of a translucent quartz glass by heat melting the preform; and (c) a step of forming a synthetic quartz glass layer by supplying synthetic silica powder into a high temperature gas atmosphere inside the crucible base body and dispersing the powder in a molten state to an inner wall surface of the crucible base body while or after the crucible base body is formed, wherein, when a silicon single crystal is pulled with the quartz glass crucible thus produced, a portion encircled by a brown ring on an inner surface of the quartz glass crucible is uniformly crystallized.

A second aspect of a production process for a quartz glass crucible for pulling a silicon single crystal of the present invention is a production process for a quartz glass crucible for pulling a silicon single crystal in which a rotary upward-open mold is used, comprising:

(a) a step of forming a preform in conformity of an inner surface of the mold by supplying silica powder into the mold;

(b) a step of forming a crucible base body made of a translucent quartz glass by heat melting the preform; and (c) a step of forming a synthetic quartz glass layer by supplying synthetic silica powder into a high temperature gas atmosphere inside the crucible base body and dispersing the powder in a molten state to an inner wall surface of the crucible base body while or after the crucible base body is formed, wherein a hydroxyl group content and a nitrogen content in the synthetic quartz glass layer are respectively adjusted in predetermined ranges and thereby a viscosity of the synthetic quartz glass layer is set in a predetermined range.

In the second aspect of a production process for a quartz glass crucible of the present invention, a viscosity of a synthetic quartz glass layer formed on the inner wall surface of the quartz glass crucible base body is preferably set at a value in the range of $10.3 \times 10^9$ to $11.0 \times 10^9$ N·s/m$^2$ at 1400° C.

Furthermore, in the second aspect of a production process for a quartz glass crucible of the present invention, a hydroxyl group content and a nitrogen content in synthetic silica powder supplied to inside the crucible base body are respectively set in predetermined ranges and thereby a hydroxyl group content and a nitrogen content in the synthetic quartz glass layer may be respectively adjusted in the predetermined ranges.

As silica powder used for forming the crucible base body, natural silica powder or synthetic silica powder may be used. Synthetic silica powder for forming the synthetic quartz glass layer preferably has a hydroxyl group content of 250 ppm or less and a nitrogen content of 100 ppm or less. Such synthetic silica powder is preferably used in order to obtain the synthetic quartz glass layer having the above described desirable hydroxyl group content and nitrogen content from the viewpoint of production of a quartz glass crucible.

As the synthetic silica powder, synthetic silica powder of high purity having contents of all metallic elements each less than 0.5 ppm is preferably adopted. Metallic elements present in the vicinity of the inner surface of a quartz glass crucible, that is the interface with a silicon melt are dissolved into a melt and incorporated into a single crystal ingot as impurities when a single crystal is pulled. Hence, the more the content of the impurities, the higher possibility for crystal defects to be produced in a single crystal ingot.

Therefore, when synthetic silica powder of high purity having contents of all metallic elements each less than 0.5 ppm is used as materials of the inner layer of a quartz glass crucible, crystal defects caused by the impurities can be suppressed. As far as contents of all the metallic elements are each in the above described range, synthetic silica powder of high purity that is obtainable in a usual and reasonable way may be used without use for any special silica powder, which can be preferable in an industrial aspect.

BEST MODE TO CARRY OUT THE INVENTION

Below, description will be made of one embodiment of the present invention with reference to the accompanying drawings. It is needless to say that the description is only given for the exemplary purpose and the present invention should not be interpreted as being limited to the description.

Figure 1:
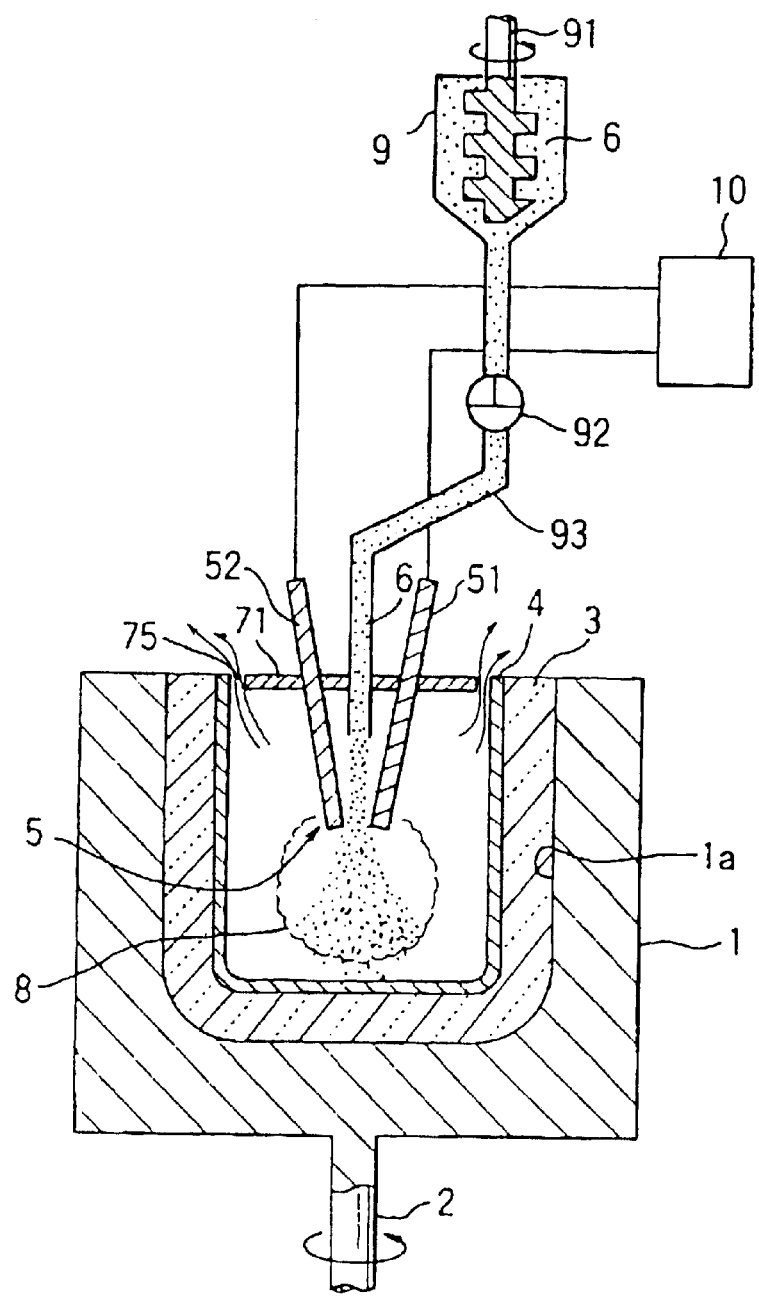
FIG. 1 is a schematic sectional view showing an apparatus used in practice of a production process for a quartz glass crucible of the present invention and the production process for a quartz glass crucible using the apparatus.
Figure 2:
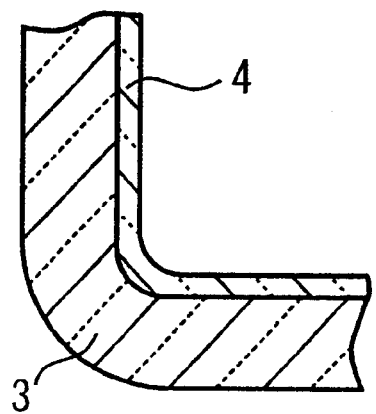
FIG. 2 is a sectional view of a part of a quartz glass crucible for pulling a silicon single crystal of the present invention.
Figure 3:
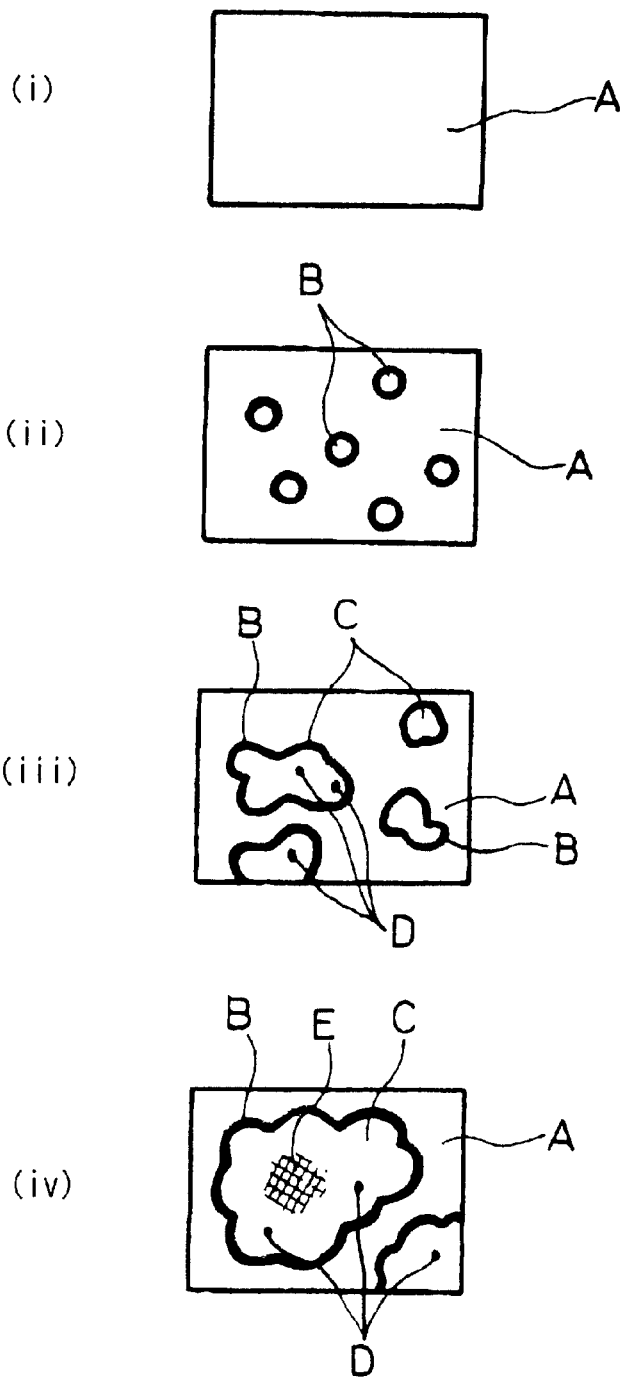
FIGS. 3a, b, and c is a sketching view showing examples of stages of formation of brown rings and devitrified specks, observed on an inner surface of a conventional quartz glass crucible.

FIG. 1 is a schematic sectional view showing an apparatus used in practice of a production process for a quartz glass crucible of the present invention and the production process for a quartz glass crucible using the apparatus. FIG. 2 is the sectional view of a part of a quartz glass crucible for pulling a silicon single crystal of the present invention.

In FIG. 1, a rotary mold 1 is equipped with a rotary shaft 2. The mold 1 has a cavity 1a formed therein and in the mold cavity 1a, there is provided a translucent quartz glass mass made of silica powder, for example natural quartz powder, that is a quartz glass crucible base body 3 which constitutes an outer layer of the quartz glass crucible.

The base body 3 is produced in such a manner that silica powder is charged into the mold 1 in rotation, the powder charged is formed into a preform having a required crucible shape while piling up along the inner wall of the mold 1 and the preform is heated from inside to melt the silica powder and the molten silica powder is thereafter solidified by cooling.

For the heating of the preform from inside thereof, an arc discharge apparatus 5 equipped with carbon electrodes 51 and 52 that are connected to a power supply 10, as shown in FIG. 1, can be employed. A plasma discharge apparatus may be employed instead of the arc discharge apparatus 5. Detailed description of production of this base body 3 appears in Japanese Patent Publication No. 4-22861.

An apparatus shown in FIG. 1 is equipped with a supply tank 9 containing synthetic silica powder 6 above the mold 1 so as to produce an inner layer 4. A discharge pipe 93 equipped with a measuring feeder 92 is connected to the supply tank 9. Agitating blades 91 are disposed in the supply tank 9. An upper opening of the mold 1 is covered with a lid 71, leaving a slit opening 75 uncovered.

After or during the time in which the base body 3 is formed, the measuring feeder 92 for supplying the synthetic silica powder 6 is opened at an adjusted degree under continuing heating by electric discharge between the carbon electrodes 51 and 52 of the arc discharge apparatus 5 to supply the synthetic silica powder into the interior of the base body 3 from the discharge pipe 93. By activating the arc discharge apparatus 5, a high temperature gas atmosphere 8 is formed inside the base body 3. Therefore, the synthetic quartz powder is supplied into the high temperature gas atmosphere 8.

Note that the high temperature gas atmosphere indicates an atmosphere formed around the carbon electrodes 51 and 52 by electric discharge between both carbon electrodes 51 and 52, which has a high temperature higher than that at which quartz glass is sufficiently molten, to be concrete, two thousand and several hundred degrees.

The synthetic silica powder supplied into the high temperature gas atmosphere 8 is at least partly molten by heat of the high temperature gas atmosphere 8 and simultaneously dispersed to the inner wall surface of the base body 3 and attached thereonto, so that a virtually bubble-free quartz glass layer, that is an inner layer 4, is formed on the inner surface of the base body 3 integrally therewith. A method of forming the inner layer 4 is detailed in Japanese Patent Publication No.4-22861.

In FIG. 2, there is shown a section of a quartz glass crucible obtained by this process. A quartz glass crucible according to the present invention comprises: an outer layer, that is a base body 3 that is formed by heat melting from inside thereof silica powder, for example natural quarts powder; and an inner layer 4 that is formed in such a manner that the synthetic silica powder is released out into a high temperature gas atmosphere, dispersed in a molten state and attached onto the inner wall surface of the base body 3. The present invention will be further described using examples hereinafter.

EXAMPLE 1

A quartz glass crucible of an outer diameter of 22 inches was produced using an apparatus shown in FIG. 1. In production, 20 kg of natural quartz powder was supplied into an upward-open mold in rotation to form a preform that is to constitute an outer layer.

The preform was heat molten from inside in an atmosphere of a humidity of 10 g/m$^3$ to form the outer layer and 3 kg of synthetic quartz glass powder of high purity having a hydroxyl group content of 50 ppm and a nitrogen content of 10 ppm was supplied into a high temperature gas atmosphere formed inside the outer layer, whereby a quartz glass crucible of an outer diameter of 22 inches was produced.

Contents of metallic elements in the used synthetic silica powder were measured and the following results were obtained: Al and Ti were both less than 0.5 ppm; Fe and Ca both 0.1 ppm; Na, K, Li and Mg all less than 0.1 ppm; Zn 10 ppb, Ni and Cr both 5 ppb; Ba 3 ppb; Cu and Pb both 1 ppb; and other elements (Mn, Co, Ga, Sr, Y, Zr, Nb, Ag, Sn, Sb, Hf, Ta, U and Th) all less than 1 ppb.

The inner layer of the quartz glass crucible had a thickness of 2 mm, a hydroxyl group content of 100 ppm and a nitrogen content of 10 ppm. A viscosity thereof at 1400° C. was measured by means of a well known penetration method to show $10.5 \times 10^9$ N s/m$^2$. Silicon single crystals were pulled using this quartz glass crucible by a Czochralski method.

Results of pulling silicon single crystals and observation of the inner surface of the quartz glass crucible are shown in Table 1.

Comparitive Example 1

Using a procedure similar to Example 1, 3 kg of synthetic quartz glass powder of a hydroxyl group content of 300 ppm, a nitrogen content less than 1 ppm was supplied into a high temperature gas atmosphere formed inside the outer layer to produce a quartz glass crucible of an outer diameter of 22 inches. An inner layer (a synthetic quartz glass layer) of the quartz glass crucible had a thickness of 2 mm, a hydroxyl group content of 350 ppm and a nitrogen content less than 1 ppm. A viscosity thereof at 1400° C. was measured in the same manner as Example 1 to show $10.1 \times 10^9$ N·s/m². Silicon single crystals were pulled using this quartz glass crucible by a Czochralski method. Results of pulling silicon single crystals and observation of the inner surface of the quartz glass crucible are shown in Table 1.

Comparitive Example 2

Using a procedure similar to Example 1, 3 kg of synthetic quartz glass powder of a hydroxyl group content less than 1 ppm and a nitrogen content of 200 ppm was supplied into a high temperature gas atmosphere formed inside the outer layer to produce a quartz glass crucible of an outer diameter of 22 inches. An inner layer (a synthetic quartz glass layer) of the quartz glass crucible had a thickness of 2 mm, a hydroxyl group content of 25 ppm and a nitrogen content of 200 ppm. A viscosity thereof at 1400° C. was measured in the same manner as Example 1 to show $11.2 \times 10^9$ N·s/m². Silicon single crystals were pulled using this quartz glass crucible by a Czochralski method. Results of pulling silicon single crystals and observation of the inner surface of the quartz glass crucible are shown in Table 1.

TABLE 1

|  | Crystallization Ratio (relative value) | Inner Surface after Pulling Single Crystal |
|---|---|---|
| Example 1 | 100 | All the surface within a brown ring was covered with a crystobalite layer. |
| Comparative Example 1 | 42 | An amorphous state and a trace of crystobalite were detected within a brown ring. |
| Comparative Example 2 | 46 | An amorphous state and a trace of crystobalite were detected within a brown ring. |

Note that a crystallization ratio used in Table 1 is a weight ratio between raw material silicon used in the pulling and dislocation-free silicon single crystal obtained by the pulling and in Table 1, relative values of Comparative Examples 1 and 2 are shown with the result of Example 1 as 100.

As is apparent from the results shown in Table 1, while the quartz glass crucible (Example 1) obtained by the present invention showed a good crystallization ratio, the quartz glass crucibles (Comparative Examples 1 and 2) obtained by conventional processes showed very low crystallization ratios.

Besides, although any of the crucibles of Example 1 and Comparative Examples 1 and 2 were used for 90 to 100 hours, in the quartz glass crucible of Example 1, all the surface within each of brown rings was covered with a crystobalite layer in a uniform manner and no glass dissolving surface was observed even after pulling of the silicon single crystal, whereas in the quartz glass crucibles of Comparative Examples 1 and 2, a great part of the surface within each of brown rings was observed as a glass dissolving surface (an amorphous state) after the pulling.

Capability of Exploitation in Industry

As described above, according to the present invention, the inner surface of the crucible is crystallized without addition of impurities, thereby impurities serving as causes of crystal defects being not incorporated into the silicon single crystal, so that deterioration of its inner surface is suppressed to improve a crystallization ratio, and accordingly productivity of the quartz glass crucible as well as a quality of the silicon single crystal is improved.

What is claimed is:

1. A quartz glass crucible for pulling a silicon single crystal comprising: a crucible base body made of a translucent quartz glass layer; and a synthetic quartz glass layer formed on an inner wall surface of the crucible base body, wherein a portion encircled by a brown ring on an inner surface of the quartz glass crucible is uniformly crystallized during pulling the silicon single crystal using the quartz glass crucible.

2. A quartz glass crucible for pulling a silicon single crystal according to claim 1, wherein a hydroxyl group content in the synthetic quartz glass layer is in the range of 50 to 250 ppm.

3. A quartz glass crucible for pulling a silicon single crystal according to claim 1, wherein a nitrogen content in the synthetic quartz glass layer is in the range of 1 to 100 ppm.

4. A quartz glass crucible for pulling a silicon single crystal according to claim 1, wherein a thickness of the synthetic quartz glass layer is in the range of 1 to 5 mm.

5. A quartz glass crucible for pulling a silicon single crystal comprising: a crucible base body made of a translucent quartz glass layer; and a synthetic quartz glass layer formed on an inner wall surface of the crucible base body, wherein a viscosity of the synthetic quartz glass layer is $10.3 \times 10^9$ to $11.0 \times 10^9$ N·s/m² at 1400° C.

6. A quartz glass crucible for pulling a silicon single crystal according to claim 5, wherein a hydroxyl group content in the synthetic quartz glass layer is in the range of 50 to 250 ppm.

7. A quartz glass crucible for pulling a silicon single crystal according to claim 5, wherein a nitrogen content in the synthetic quartz glass layer is in the range of 1 to 100 ppm.

8. A quartz glass crucible for pulling a silicon single crystal according to claim 5, wherein a thickness of the synthetic quartz glass layer is in the range of 1 to 5 mm.

9. A production process for a quartz glass crucible for pulling a silicon single crystal in which a rotary upward-open mold is used, comprising the steps of:

(a) forming a preform in conformity of an inner surface of the mold by supplying silica powder into the mold;

(b) forming a crucible base body made of a translucent quartz glass by heat melting the preform; and (c) forming a synthetic quartz glass layer by supplying synthetic silica powder into a high temperature gas atmosphere inside the crucible base body and dispersing the powder in a molten state to an inner wall surface of the crucible base body while or after the crucible base body is formed, wherein when the quartz glass crucible thus produced is used and a silicon single crystal is pulled with the quartz glass crucible, a portion encircled by a brown ring on an inner surface of the quartz glass crucible is uniformly crystallized.

10. A production process for a quartz glass crucible for pulling a silicon single crystal according to claim 9, wherein the synthetic silica powder has a hydroxyl group content of 250 ppm or less and a nitrogen content of 100 ppm or less.

11. A production process for a quartz glass crucible for pulling a silicon single crystal according to claim 9, wherein the synthetic silica powder is synthetic silica powder of high purity having contents of all metallic elements each less than 0.5 ppm.

12. A production process for a quartz glass crucible for pulling a silicon single crystal in which a rotary upward-open mold is used, comprising the steps of:
   (a) forming a preform in conformity of an inner surface of the mold by supplying silica powder into the mold;
   (b) forming a crucible base body made of a translucent quartz glass by heat melting the preform; and
   (c) forming a synthetic quartz glass layer by supplying synthetic silica powder into a high temperature gas atmosphere inside the crucible base body and dispersing the powder in a molten state to an inner wall surface of the crucible base body while or after the crucible base body is formed, wherein
   a hydroxyl group content and a nitrogen content in the synthetic quartz glass layer are respectively adjusted in predetermined ranges and thereby a viscosity of the synthetic quartz glass layer is set in a predetermined range.

13. A production process for a quartz glass crucible for pulling a silicon single crystal according to claim 12, wherein a viscosity of the synthetic quartz glass layer is in the range of $10.3 \times 10^9$ to $11.0 \times 10^9$ N·s/m² at 1400° C.

14. A production process for a quartz glass crucible for pulling a silicon single crystal according to claim 13, wherein the synthetic silica powder has a hydroxyl group content of 250 ppm or less and a nitrogen content of 100 ppm or less.

15. A production process for a quartz glass crucible for pulling a silicon single crystal according to claim 14, wherein the synthetic silica powder is synthetic silica powder of high purity having contents of all metallic elements each less than 0.5 ppm.

16. A production process for a quartz glass crucible for pulling a silicon single crystal according to claim 13, wherein the synthetic silica powder is synthetic silica powder of high purity having contents of all metallic elements each less than 0.5 ppm.

17. A production process for a quartz glass crucible for pulling a silicon single crystal according to claim 12, wherein the synthetic silica powder has a hydroxyl group content of 250 ppm or less and a nitrogen content of 100 ppm or less.

18. A production process for a quartz glass crucible for pulling a silicon single crystal according to claim 17, wherein the synthetic silica powder is synthetic silica powder of high purity having contents of all metallic elements each less than 0.5 ppm.

19. A production process for a quartz glass crucible for pulling a silicon single crystal according to claim 12, wherein the synthetic silica powder is synthetic silica powder of high purity having contents of all metallic elements each less than 0.5 ppm.

* * * * *